United States Patent [19]

Cline et al.

[11] 4,141,757

[45] Feb. 27, 1979

[54] UNIFORM THERMOMIGRATION UTILIZING SAMPLE MOVEMENT

[75] Inventors: Harvey E. Cline; Thomas R. Anthony, both of Schenectady, N.Y.

[73] Assignee: General Electric Company, Schenectady, N.Y.

[21] Appl. No.: 854,096

[22] Filed: Nov. 23, 1977

Related U.S. Application Data

[63] Continuation-in-part of Ser. No. 733,238, Oct. 18, 1976, Pat. No. 4,081,293.

[51] Int. Cl.² .......................................... H01L 21/228
[52] U.S. Cl. ..................................... 148/1.5; 148/171; 148/177; 148/179; 148/187; 148/188
[58] Field of Search ................. 148/1.5, 171, 172, 177, 148/179, 187, 188

[56] References Cited

U.S. PATENT DOCUMENTS

| 3,998,661 | 12/1976 | Chang et al. | 148/1.5 |
| 4,012,236 | 3/1977 | Anthony et al. | 148/1.5 |
| 4,081,293 | 3/1978 | Cline et al. | 148/1.5 |

Primary Examiner—G. Ozaki
Attorney, Agent, or Firm—Winegar, Donald M.; Joseph T. Cohen; Charles T. Watts

[57] ABSTRACT

The geometric configuration of a molten zone migrating through a solid body of semiconductor material during thermal gradient zone melting is maintained by a combination of noncentro-symmetric rotation about an axis displaced from the central axis of the body and translation of the solid body while being heated by a suitable heat source.

13 Claims, 14 Drawing Figures

UNIFORM THERMOMIGRATION UTILIZING SAMPLE MOVEMENT

CROSS-REFERENCE TO RELATED APPLICATION

This application is a Continuation-in-Part of application Ser. No. 733,238, filed on Oct. 18, 1976 now U.S. Pat. No. 4,081,293.

BACKGROUND OF THE INVENTION

1. Field of the Invention

This invention relates to the migration of a molten zone through a solid body of semiconductor material by thermal gradient zone melting.

2. Description of the Prior Art

W. G. Pfann described in "Zone Melting", John Wiley and Sons, Inc., New York (1966), a thermal gradient zone melting process to produce various desirable material configurations in a body of semiconductor material. The process had previously been disclosed in his issued U.S. Pat. No. 2,813,048, based on his application filed June 24, 1954. In both instances, cavities are generally formed in the surface of the body and a piece of wire of the metal to be migrated is disposed on the cavity. However, the resulting structures were not desirable for semiconductor usage.

M. Blumenfeld, in U.S. Pat. No. 3,897,277, teaches alloying aluminum to the surface of the body of silicon semiconductor material in an attempt to maintain the registry of the pattern of metal deposits to be migrated. However, problems of precise registry of the metal still plague one's attempt to obtain the precision necessary to obtain an array of deep diodes suitable for making x-ray imaging devices.

Recently, Thomas R. Anthony and Harvey E. Cline, discovered that employing selective chemical etching of the surface and preferred crystallographic orientation of the surface and molten zones enabled one to employ thermal gradient zone melting processing to assist in making semiconductor devices commercially feasible. The improved process resulted in a large savings in energy required to process semiconductor materials and increased yields. For a further teaching of the improved process, one is directed to their teachings in their recently granted U.S. Pat. No. 3,904,442, and copending patent application Ser. No. 519,913 filed Nov. 1, 1974, now U.S. Pat. No. 3,979,230 assigned to the assignee of the present invention and incorporated therein by reference.

To practice thermal gradient zone melting on a commercial basis, one should make the process as simple as possible. Consequently, John Boah in his copending U.S. Pat. application Ser. No. 578,807 filed May 19, 1975, and now U.S. Pat. No. 4,001,047, describes the use of radiant energy as a source for the migration or movement of a molten zone through a solid body. This application is assigned to the assignee of the present invention and is incorporated herein by reference. The process and apparatus arrangement taught by Boah is very practical for the manufacture of many devices. In the manufacture of certain semiconductor devices, the maintenance of a temperature gradient precisely in a direction perpendicular to a major surface of the semiconductor body being treated is desirable. Maintenance of such a temperature gradient and the elimination of lateral or transverse temperature gradients ensures the precise orientation of junctions within the devices and maximization of manufacturing yields.

One source of radiant energy which is presently being employed in practicing temperature gradient zone melting is quartz lamps having tungsten filaments. A heat source may comprise a plurality of such lamps oriented in a parallel array. However, due to the construction the lamps and the spacing of the lamps from each other within the array, temperature irregularities as great as 40° C. over distances of approximately 1 cm have been observed in the area of illumination of such an array. Such temperature irregularities contribute to lateral temperature gradients which adversely affect the device being manufactured in a manner hereinafter described.

Direct observation of such an array of lamps when energized has indicated that the temperature irregularities stemming from the construction of the lamps are due to a self-shadowing of the coiled tungsten filament, the shadowing of the disk shaped filament holders disposed within the quartz envelope, and the refractive properties of the quartz envelopes. The spacing of the lamps and thus the tungsten filaments within the array also contributes to the non-uniformities in temperature of the radiation emitted by the lamps. Moreover, non-uniformities in reflection of any reflectors employed with the quartz lamps further contributes to the irregularities in temperature experienced by the semiconductor bodies heated by the lamps and thus enhances the creation of lateral temperature gradients. Additionally, any quartz plates disposed between the lamps and the semiconductor bodies such as, for example, a quartz convection suppressor plate or a quartz coverplate for an air cooling channel surrounding the lamps may possess refractive properties which may further contribute to temperature irregularities and the creation of lateral temperature gradients.

During the migration of the molten zone through the semiconductor material, any lateral temperature gradients distort the movement of the molten zone. That is, the geometrical configuration of the regions produced by the movement of the molten zone through the solid body changes in accordance with the thermal gradients, both lateral and normal, in the region of movement. The lateral thermal gradient is of particular concern in that when forming grid structures, for electrical isolation of devices, distortion of the array forming the grid due to these lateral gradients may be so great as to eliminate the outer 2 mm peripheral portion of a wafer from being usable. The geometrical pattern of the grid structure is very distorted. Separation of isolation regions occur and surface tension pulls intersecting regions apart during migration.

It is therefore an object of this invention to provide a new and improved thermal gradient zone melting process which overcomes the deficiencies of the prior art.

Another object of this invention is to provide a new and improved thermal gradient zone melting process wherein any lateral and/or radial temperature gradients in a body or wafer of semiconductor material being processed thereby is minimized.

Other objects of this invention will, in part, be obvious and will, in part, appear hereinafter.

In accordance with the teachings of this invention, there is provided a new and improved thermal gradient zone melting method for migrating a molten zone through a solid body of semiconductor material. The method comprises the process steps of selecting a body of single crystal semiconductor material having two major opposed surfaces which are, respectively, the top and bottom surfaces thereof. The body has a predetermined type conductivity, a predetermined level of resistivity, a preferred diamond crystal structure, a preferred planar crystal orientation for at least the top surface, and a first preferred crystal axis and a central axis, which are each substantially perpendicular to the top surface and substantially parallel with each other. A layer of metal of a predetermined thickness and a predetermined geometrical configuration is preferably vapor deposited on the major surface having the preferred planar crystal orientation. The processed body is placed on a support and rotated noncentro-symmetrically about an axis displaced from the central axis of the body while simultaneously translated in a plane parallel to a heat source through a distance heated by the heat source. The heat source comprises a parallel array of lamps. Translation is performed at an angle of from 30° to 60° to the central axis of the parallel array of lamps. Preferably, the lamps are of the infrared type.

The body and the deposited metal are heated to a preselected elevated temperature sufficient to form a melt of a metal-rich semiconductor material on the surface of the body while continuing any one of the aforementioned movements of the body. A temperature gradient is established across the body substantially parallel with the central axis of the body and the first preferred crystal axis of the crystal structure while continuing the movement of the body. The surface on which the melt is formed is retained at the lower temperature. Thereafter, each melt of metal-rich semiconductor material is migrated as a molten zone through the solid body of semiconductor material for a sufficient period of time to reach a predetermined distance into the body from the surface on which the melt is formed. The movement of the body is continued during this migration. A region of recrystallized semiconductor material of the body having solid solubility of the deposited metal therein is formed in the body by each melt. Each region so produced has a predetermined geometric configuration, a substantially uniform cross-sectional area and a substantially uniform level of resistivity throughout the entire region.

DESCRIPTION OF THE INVENTION

Figure 1:
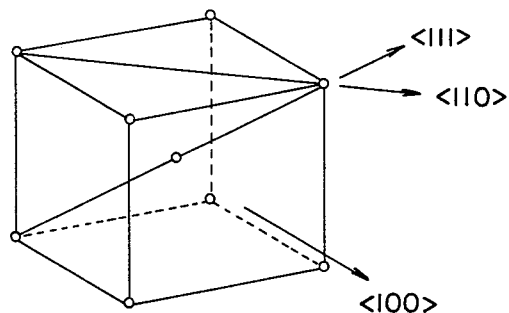
FIG. 1 is a diamond cubic crystal structure.

Referring now to FIG. 1, there is shown the diamond cubic crystal structure of silicon, silicon carbide, germanium, gallium arsenide, and other semiconductor materials consisting of a compound of a Group II element and a Group VI element and a compound of a Group III element and a Group V element.

In order to practice the new improved thermal gradient zone melting process of this invention, it is necessary that the planar crystal orientation of one of the two major opposed surfaces of the wafer of semiconductor material be one selected from the group consisting of (100), (110), and (111). These preferred planar orientations, crystal axis of migration, preferred crystal axis orientation of linear metal deposits to be migrated, and the like are described in detail in our recently issued patents U.S. Pat. No. 3,899,362 and U.S. Pat. No. 3,904,442 the teachings of which are incorporated herein by reference and made a part of this application. A summary of the preferred crystal axes embodied for migrating metal "wires" is given in the following Table:

TABLE

| Wafer Plane | Migration Direction | | Stable Wire Directions | Stable Wire Sizes |
|---|---|---|---|---|
| (100) | < 100 > | | < 011 >* | < 100 microns |
| | | | < 011 >* | < 100 microns |
| (110) | < 110 > | | < 110 >* | < 150 microns |
| (111) | < 111 > | a) | < 011 > | |
| | | | < 101 > | < 500 microns |
| | | | < 110 > | |
| | | b) | < 112 >* | |
| | | | < 211 >* | < 500 microns |
| | | | < 121 >* | |
| | | c) | Any other Direction in (111) plane* | < 500 microns |

*The stability of the migrating wire is sensitive to the alignment of the thermal gradient with the < 100 >, < 110 > and < 111 > axis, respectively.
+Group a is more stable than group b which is more stable than group c.

In addition, to migrating metal "wires" the improved process is also suitable for migrating any metal layer having a preferred geometric shape such for example, as a grid structure of intersecting planar regions, annular shapes, square-like regions, hexagonal shaped configurations, disc-like areas and the like.

In order to describe the process in more detail, the semiconductor material is said to be silicon of N-type conductivity and the metal to be migrated is said to be aluminum. These materials are chosen for illustrative purposes only without any intention of limiting the scope of the present invention.

Figure 2:
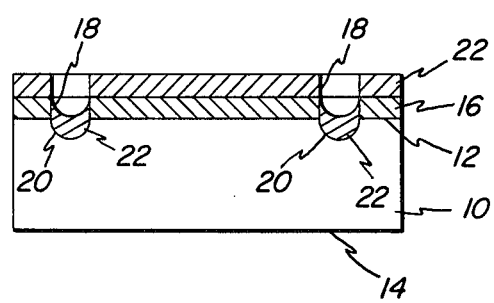
FIG. 2 is a side elevation view, partly in cross-section of a body of semiconductor material processed in accordance with the teachings of this invention.

Referring now to FIG. 2, a body 10 of silicon semiconductor material, having N-type conductivity and a preferred level of resistivity, has first and second major opposed surfaces 12 and 14, being respectively the top and bottom surfaces thereof. At least the first major surface 12 has a preferred planar crystal orientation which is one of the group consisting of (100), (110) and (111) as described heretofore. The body 10 also has a central axis which is substantially parallel with a first preferred axis of the crystal structure of the material and substantially perpendicular to the surfaces 12 and 14.

The body 10 is mechanically polished, chemically etched to remove any damaged surfaces, rinsed in deionized water and dried in air. An acid resistant mask 16 is disposed on the first major surface 12 of the body 10. Preferably, the mask is of silicon oxide which is either thermally grown or vapor deposited on the surface 12 by any of the methods well known to those skilled in the art. Other suitable materials for the layer of mask 16 are silicon nitride, aluminum nitride, aluminum oxide and the like. Employing well known photolithographical techniques, a photoresist, such, for example, as Kodak Metal Etch Resist, is disposed on the surface of the silicon oxide layer 16. The resist is dried by baking at a temperature of about 80° C. A suitable mask of the desired geometrical configuration, wherein the lines or disc-like areas are of a predetermined width or diameter is disposed on the layer of photoresist and exposed to ultraviolet light. After exposure, the layer of photoresist is washed in xylene to open windows in the mask where the one or more annular geometric configurations is desired so as to be able to selectively etch the silicon oxide layer 16 exposed in the windows.

Selective etching of the layer 16 of silicon oxide is accomplished with a buffered hydrofluoric acid solution ($NH_4F$-HF). The etching is continued until a second set of windows 18 corresponding to the windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180° C. or by immersion in a mixture of 1 part by volume hydrogen peroxide and 1 part by volume concentrated sulphuric acid.

Referring now to FIG. 2, a selective chemical etching of the exposed surface area of the body 10 is accomplished with a mixed acid solution. The mixed acid solution is 10 parts by volume nitric acid, 70%, 4 parts by volume acetic acid, 100%, and 1 part by volume hydrofluoric acid, 48%. At a temperature of from 20° C. to 30° C., the mixed solution selectively etches the silicon of the body 10 at a rate of approximately 5 microns per minute. An annular trough or trough-like depression 20 is etched in the surface 12 of the body 10 beneath window 18 of the oxide layer 16. The selective etching is continued until the depth of the trough 20 is approximately equal to the width of the window 18 in the silicon oxide layer 16. However, it has been discovered that the trough 20 should not be greater than approximately 100 microns in depth because undercutting of the silicon oxide layer 16 will occur. Undercutting of the layer 16 of silicon oxide has a detrimental affect on the width of the wire or molten zone to be migrated through the body 10. Preferably, a depth of 25 microns has been found suitable to practice the novel process. Etching for approximately 5 minutes at a temperature of 25° C. will result in a trough 20 of from 25 to 30 microns in depth for a width of the window 20 of from 10 to 500 microns. The etched body 10 is rinsed in distilled water and blown dry. Preferably, a gas such, for example, as freon, argon and the like, is suitable for drying the processed body 10. The processed body 10 is disposed in a metal evaporation chamber. A layer 22 of a suitable metal is deposited on the remaining portions of the layer 16 of silicon oxide and on the exposed silicon in the annular trough 20. The metal in the trough 20 is the metal "wire" or mass to be migrated or moved as a molten zone through the solid body 10. The metal of the layer 22 comprises a material, either substantially pure in itself or admixed with one or more materials to impart a predetermined second and opposite type conductivity to the material of the body 10 through which it migrates. The thickness of the layer 22 is approximately equal to the depth of the trough 20. Therefore, if the trough 20 is 20 to 25 microns deep, the layer 20 is approximately 20 to 25 microns in thickness. A suitable material for the metal layer 22 is aluminum to obtain P-type regions in N-type silicon semiconductor material. Prior to migrating the metal in the trough 20 through the body of silicon 10, the excess metal of the layer 22 is removed from the silicon oxide layer 16 by such suitable means as grinding the excess metal with a 600 grit carbide paper and photolithographical technique embodying selective chemical etching of the excess metal of the layer 22.

It has been discovered that the vapor deposition of the layer 22 of aluminum metal should be performed at a pressure of approximately $1 \times 10^{-5}$ torr but not greater than $5 \times 10^{-5}$ torr. When the pressure is greater than $5 \times 10^{-5}$ torr, we have found that in the case of aluminum metal vapor deposited in the trough 20, the aluminum does not penetrate into the silicon and migrate through the body 10. It is believed that the layer of aluminum is saturated with oxygen and prevents reduction by the aluminum metal of the very thin silicon oxide layer between the deposited aluminum and the silicon that was formed in the air shortly after etching the troughs 18. Thus, the initial melt of aluminum and silicon required for migration is not obtained because of the inability of aluminum to wet the silicon interface. In a like manner, aluminum deposited by sputtering is not desirable as the aluminum appears to be saturated with oxygen from the process, thereby preventing the reduction of any intervening silicon oxide. The preferred methods of depositing aluminum on the silicon body 10 are by the electron beam method and the like wherein little if any oxygen can be trapped in the aluminum.

Figure 3:
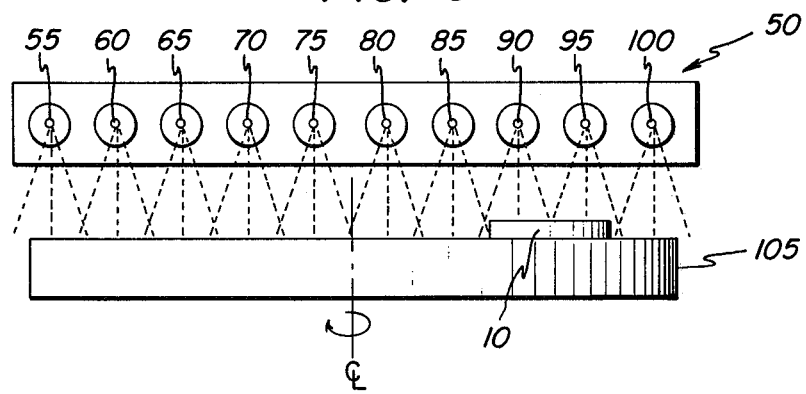
FIG. 3 illustrates a heat source and a suitable means for supporting the body of FIG. 2 and rotating the body noncentro-symmetrically during further processing.
Figure 4:
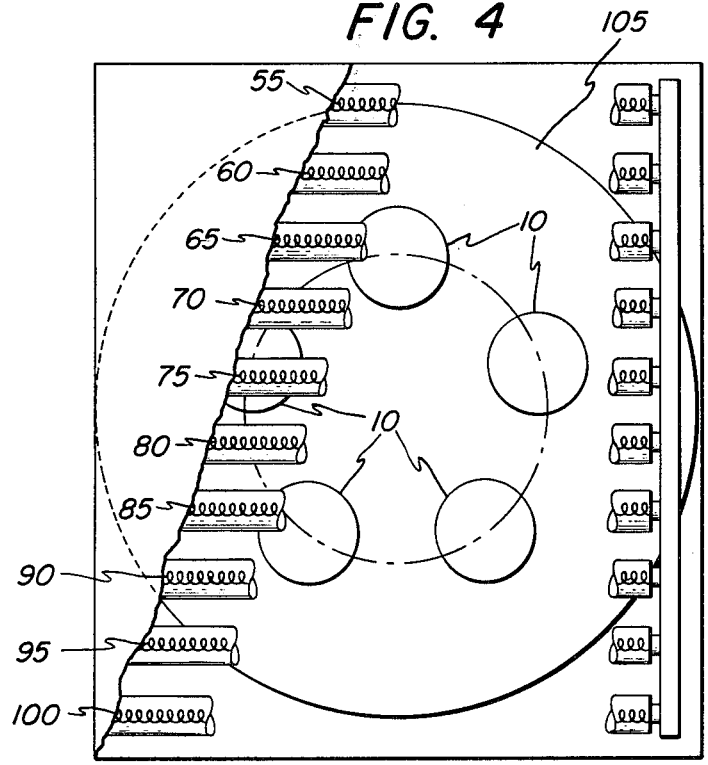
FIG. 4 is a top planar view illustrating the noncentro-symmetrical rotation of a plurality of the bodies of FIG. 2 in accordance with the teachings of this invention.

With reference to FIGS. 3 and 4, the processed body 10 is placed in a thermal migration apparatus, and the metal 22 in the trough 20 is migrated through the body 10 as a molten zone by a thermal gradient zone melting process. The body 10 is situated in the apparatus in a manner whereby a source of radiant energy 50 comprising a plurality of parallel quartz infrared lamps 55, 60, 65, 70, 75, 80, 85, 90, 95 and 100 spaced equally apart irradiates the body 10. The body 10 is mounted on a table 105 in a manner whereby the bottom surface 14 of the body is maintained at a temperature level sufficient to establish and maintain a thermal gradient necessary for migration of the wire 22 through the body 10. Preferably, the table 105 rotates about its own vertical axis, or a first center line, and the center line of the energy source is preferably aligned with this first center line. The rotation of the table 105 may be clockwise or counter clockwise.

In commercial processing as illustrated in FIG. 4, more than one processed body 10 may undergo thermal gradient zone melting processing simultaneously. The bodies 10 are arranged on the table 105 such that preferably all the vertical axes of the bodies are equidistant from the vertical axis of the table 105. As the table 105 rotates about its vertical axis each of the bodies 10 of semiconductor material moves in a circular direction which, at any point of the bodies' travel is the vector sum of movements parallel and perpendicular to the lamps. Therefore, by repeated rotations of table 105 during the temperature gradient zone melting operation each body 10 will experience many random temperature irregularities in the radiation emitted by the lamps due to the lamp structure and spacing but will experience each irregularity for only an infinitesinal period of time. Therefore, each temperature gradient experienced by a body will cause only a slight deflection or wiggle in the melt zone which ideally extends through the bodies perpendicular to the major surfaces thereof. However, since during the temperature gradient zone melting process table 105 will make a number of revolutions, each body will be exposed to radiation emitted by the lamp array at a multiplicity of locations and will be exposed to a multiplicity of temperature irregularities. It has been discovered that the exposure of the bodies to many random irregularities for only brief periods of time has the effect of each irregularity or lateral gradient to be effectively cancelled by an opposing irregularity of lateral gradient. Therefore, each wiggle or deflection in the melt zone is cancelled by a wriggle or deflection in an opposite direction giving the edges of each melt zone an extremely fine saw tooth configuration. The saw-tooth configuration is so fine that no adverse effects result therefrom and the devices produced by this method are characterized by abrupt, well defined junctions. For a source 50 of infrared energy at a distance of 2 centimeters from the top surface of table 105, it has been found desirable to rotate the table 105 at approximately 1 revolution per minute.

Figure 5:
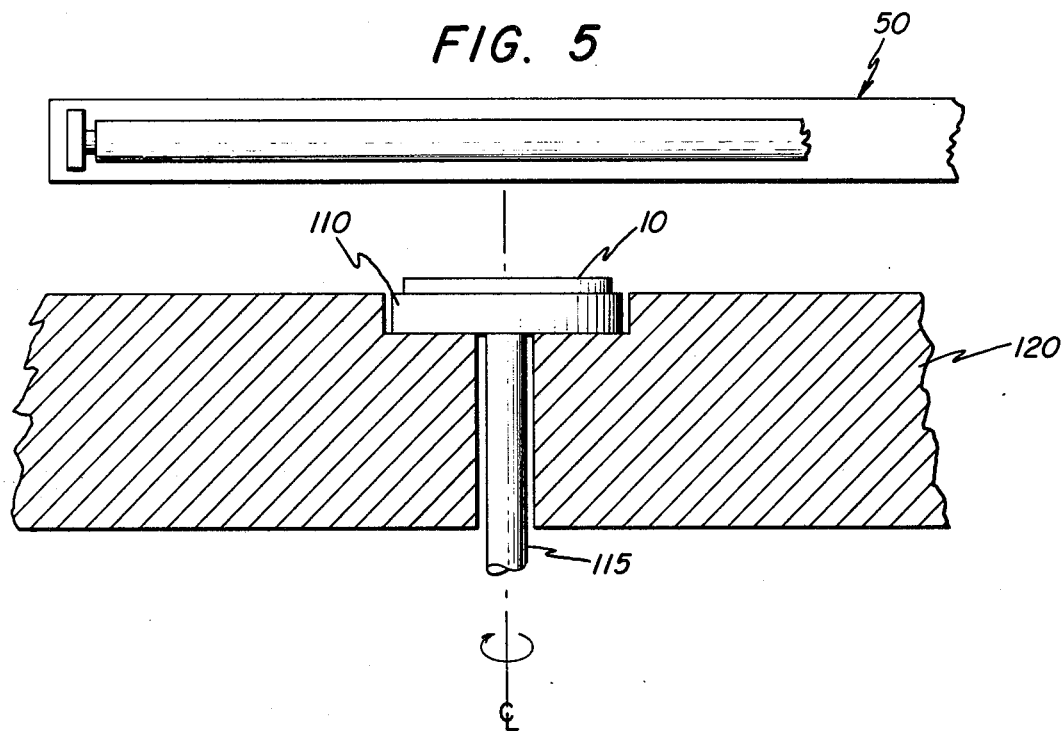
FIG. 5 illustrates a suitable means for supporting the body of FIG. 2 and rotating the body centro-symmetrically during further processing.
Figure 6:
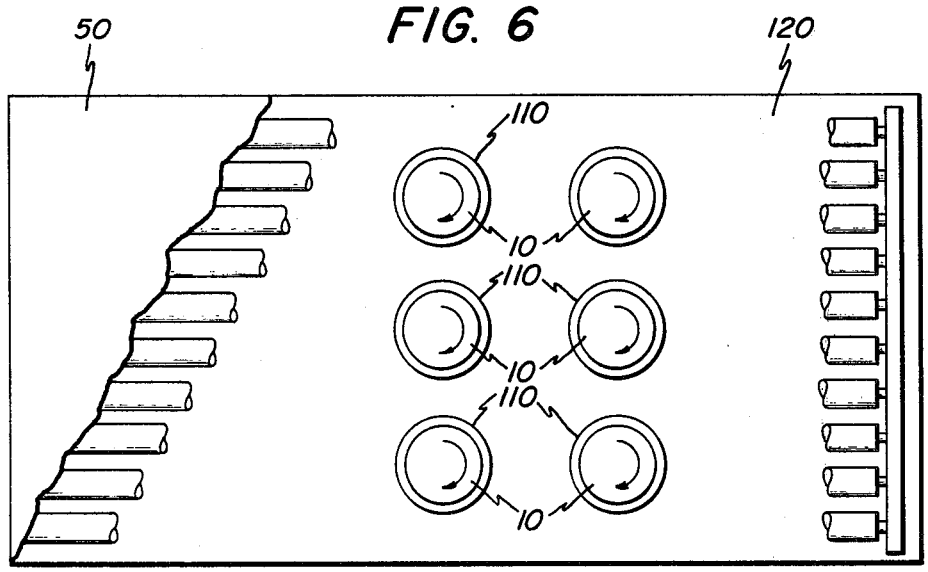
FIG. 6 is a top planar view partially broken away of the centro-symmetric rotation of a plurality of the bodies of FIG. 2 in accordance with the teachings of this invention and one type of heat source which may be used to heat the bodies.
Figure 7:
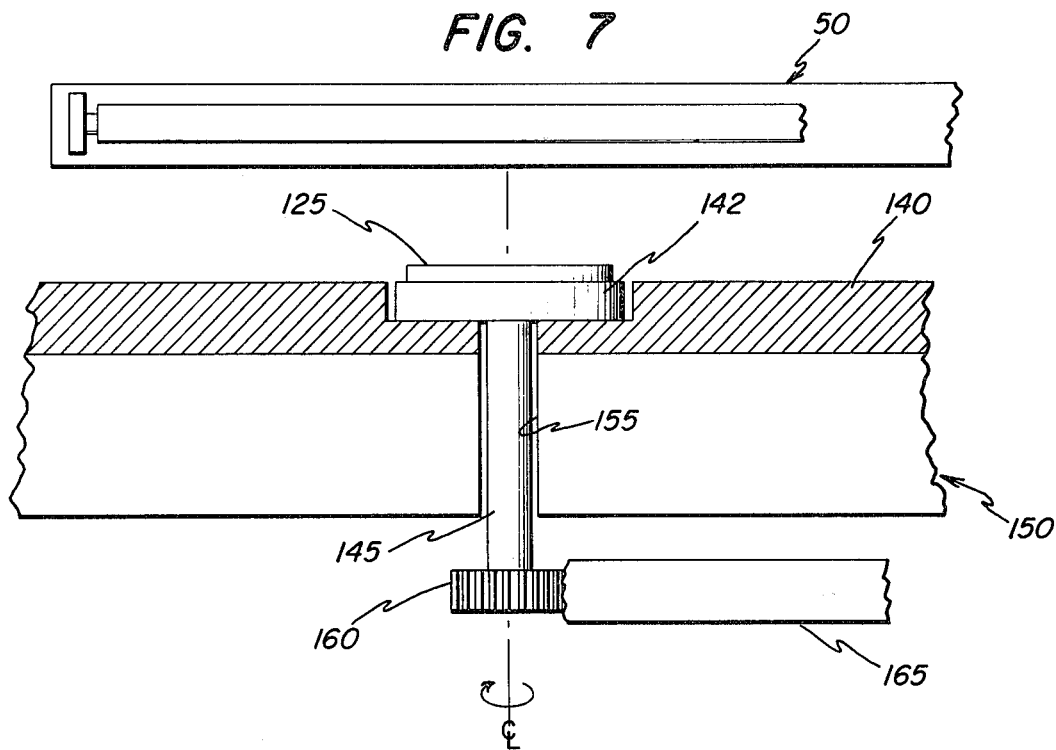
FIG. 7 illustrates a suitable means for supporting the body of FIG. 2 and centro-symmetrically rotating the body while translating the body during further processing.
Figure 8:
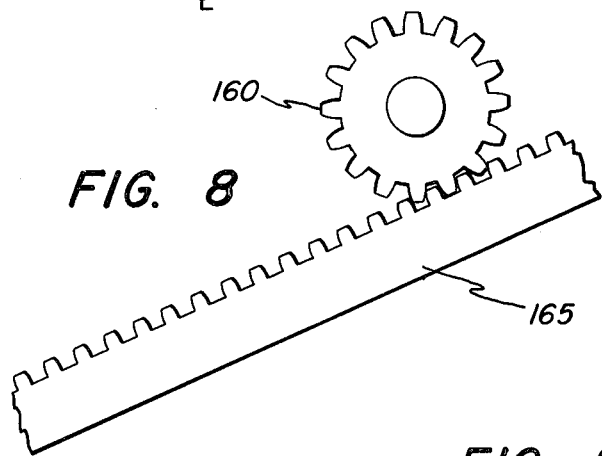
FIG. 8 is a top planar view partially broken away of apparatus illustrated in FIG. 7 employed to centro-symmetrically rotate the body of FIG. 2 while that body translates.

An alternate means for moving bodies 10 to achieve the desired results is shown in FIGS. 5 and 6. Referring to FIGS. 5 and 6, there is shown a plurality of semiconductor bodies 10 rotating centro-symmetrically beneath a source of radiant energy 50 the same as that illustrated in FIGS. 3 and 4. Each body 10 is supported by a rotatable platform 110 fixed to a shaft 115 and supported by a stationary table 120. Shafts 115 are rotatable by any suitable means such as gear sets or belt-pulley arrangements (not shown) operatively connected to a motor or other suitable prime mover. The centrosymmetric rotation of bodies 10 causes each point on any one body to experience a multiplicity of random temperature irregularities and lateral temperature gradients resulting therefrom, each for a brief period of time. This causes the melt zones to take on fine saw tooth edge configurations due to the cancelling effect of such lateral gradients as hereinabove set forth with respect to the method and apparatus illustrated in FIGS. 3 and 4. However, as was the case with respect to the previously discussed noncentro-symmetric rotation of bodies 10, this saw tooth configuration is so fine that no adverse effects result therefrom and the devices produced by this method of centro-symmetric rotation possess the abrupt well defined junctions desired from a temperature gradient zone melting process.

Figure 9:
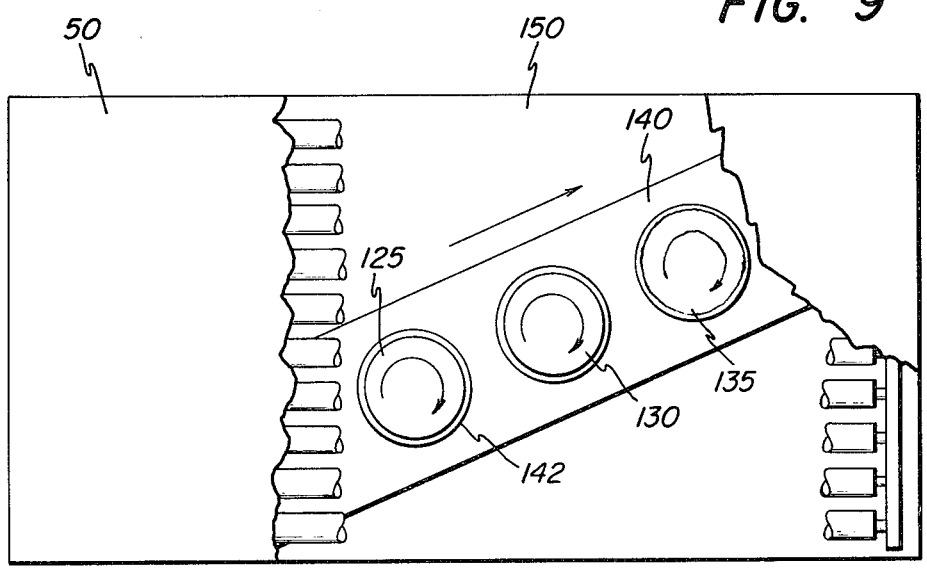
FIG. 9 is a top planar view, partially broken away, of the translation of the body of FIG. 2 and the combined translation and centro-symmetric rotation of a plurality of the bodies of FIG. 2 in accordance with this invention and one type of heat source which may be used to heat the bodies.

A second alternate means for moving bodies 10 to achieve the desired results of temperature gradient zone melting is shown in FIGS. 7, 8, 9 and 10. Referring now to FIGS. 7, 8, 9 and 10, there is shown a plurality of semiconductor bodies 125, 130 and 135. Each of the bodies shown in FIG. 9 is supported by translating conveyor 140, causing the bodies to translate in the same direction as the conveyor. The translation of the bodies in a direction skewed with respect to the parallel array of lamps or source of radiant energy 50 causes the bodies to experience a multiplicity of lateral gradients due to the structure and spacing of the lamps substantially as previously described. However, the velocity of conveyor 140 is such that these lateral gradients are experienced by the semiconductor bodies for only brief periods of time. The exposure to a multiplicity of random lateral gradients for only brief periods of time causes these lateral gradients to cancel each other giving the edges of the melt zones the fine saw tooth configuration set forth hereinabove. This fine saw tooth configuration defines for all practical purposes a straight melt zone edge providing the abrupt well defined junctions desired by the temperature gradient zone melting process. In the preferred embodiment, the bodies are translated at an angle of between 30° and 60° from the axes of the lamps employed in the heat source.

Figure 10:
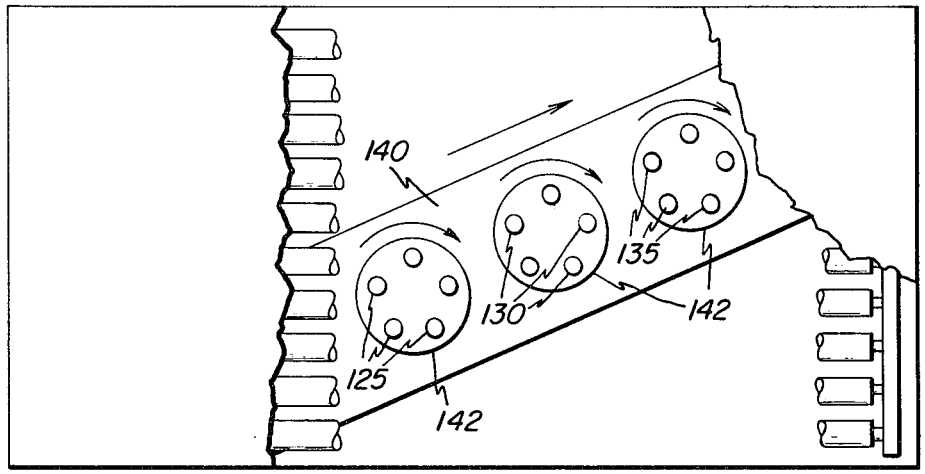
FIG. 10 is a top planar view, partially broken away, of the combined translation and noncentro-symmetric rotation of a plurality of bodies of semiconductor material in accordance with the teachings of this invention.

Should it be desired to make the junctions even more well defined, the wiggles in the melt zone edges can be made even finer by centro-symmetrically rotating the semiconductor body while the body translates. Such a combined semiconductor rotating and translating motion is experienced by bodies 125, 130 and 135. Semiconductor bodies 125, 130 and 135 are supported by rotatable platforms 142, each fixed to a shaft 145. Platforms 142 are supported by conveyor 140 apertured to receive shafts 145. A stationary table 150 provides a supporting base for conveyor 140 and is slotted at 155 to accommodate shafts 145. Each shaft 145 has a pinion 160 fixed to the end thereof. Pinion 160 is engageable by stationary rack 165 which causes the pinion and thus platform 142 to rotate as conveyor 140 moves platform 142 in a rectilinear direction. The combined rotation and translation of semiconductor bodies 125, 130 and 135 causes these bodies to experience the random lateral temperature gradients for even shorter periods of time than if the bodies were moved only in translation thereby further enhancing the definition of the melt zones and thus the properties of the devices formed by the temperature gradient zone melting process. With reference to FIG. 10, if platforms 142 are of sufficient diameter, a plurality of semiconductor bodies may be placed on each platform 142 in the manner in which semiconductor bodies 10 are placed on table 150 as illustrated in FIG. 4. In this arrangement, shown in FIG. 10, the semiconductor bodies will experience a combined noncentrosymmetric rotation and translation.

A thermal gradient of approximately 50° C. per centimeter between the bottom surface 14, which is the hot face and the surface 12, which is the cold face, has been discovered to be appropriate when the apparatus operating temperature is from 800° C. to 1400° C. The process is practiced for a sufficient length of time to migrate or move, the metal layer as a molten zone through the solid body 10. For example, for an aluminum wire of 20 microns thickness, a thermal gradient of 50° C./cm, a 1200° C. mean temperature of body 10 during processing, and at ambient or atmospheric pressure, a heating time of 10 minutes is required to migrate the annular wire 22 through the silicon body 10 having a thickness of 10 mils.

The temperature gradient zone melting process and apparatus employed in the process is not a part of this invention. Additionally, for a more thorough understanding of the temperature gradient zone melting process employed in this invention and for a more thorough description of the apparatus employed for the process, one is directed to the copending applications and U.S. Patents of Anthony and Cline, which are incorporated herein by reference thereto, and entitled Method of Making Deep Diode Devices, U.S. Pat. No. 3,901,736; High Velocity Thermal Migration Method of Making Deep Diodes, U.S. Pat. No. 3,910,801; Deep Diode Devices and Method and Apparatus, Ser. No. 552,154 filed Feb. 24, 1975 now U.S. Pat. No. 4,075,038; High Velocity Thermomigration Method of Making Deep Diodes, U.S. Pat. No. 3,898,106; Deep Diode Device and Method, U.S. Pat. No. 3,902,925; and Stabilized Droplet Method of Making Deep Diodes Having Uniform Electrical Properties, U.S. Pat. No. 3,899,361.

Figure 11:
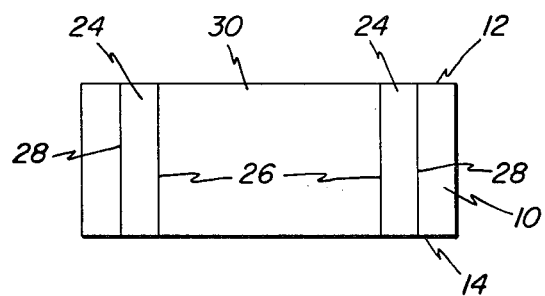
FIGS. 11, 12, 13 and 14 are side elevation view partly in cross-section of bodies of semiconductor material processed in accordance with the teachings of this invention.

Upon completion of the temperature gradient zone melting process, the resulting processed body 10 is as shown in FIG. 11. The thermal migration of the metal in the troughs 18 as a molten zone through the body 10 produces a processed body 10 having region 24 of a second and opposite type conductivity than the body 10. The material of the region 24 is recrystallized semiconductor material of the body 10 suitably doped with a material comprising the metal wire and having an impurity concentration sufficient to obtain the desired conductivity. The metal retained in the recrystallized region is substantially the maximum allowed by the solid solubility of the metal in the semiconductor material through which it has been thermomigrated. It is recrystallized material having solid solubility of the metal therein. The region 24 has a constant uniform level of impurity concentration throughout the entire region to impart the predetermined type conductivity and predetermined level of resistivity thereto. The width or diameter of the region 24 is substantially constant throughout the entire region. In particular, when the body 10 is of silicon semiconductor material of N-type conductivity, the region 24 of aluminum doped recrystallized silicon forms the required P-type conductivity region.

P-N junctions 26 and 28 are formed by the abutting contiguous surfaces of the material of opposite type conductivity. The P-N junctions 26 and 28 are well defined and show an abrupt transition from one region of conductivity to the next adjacent region of opposite type conductivity. The abrupt transition produces a step P-N junction. Laterally graded P-N junctions 26 and 28 may be obtained by a postdiffusion heat treatment of the region 24.

When region 24 is part of a grid structure or an annular shaped region it encloses a region 30 of N-type conductivity material. The material is part of the original material of the body 10. The region 24 functions to electrically isolate the region 30 from the remainder of the body 10.

Alternately, the metal to be migrated may be sintered by a heat treatment process prior to forming the melt of metal-rich semiconductor material. An elevated temperature of from 500° C. to 550° C. for a period of time from 5 to 30 minutes will sinter the metal or disc to the semiconductor material of the trough-like depressions. A preferred sintering temperature is 525° C. ± 5° C. for a period of time of about 20 minutes. The process produces incipient fusion of a portion of the metal to the semiconductor material of the surface with which the metal is in contact. This sintering operation aids in preventing surface tension from pulling the melt of metal-rich semiconductor material apart into two or more segments prior to initiation of the migration of the melt into the solid body.

For a more detailed description, one is referred to the teachings of copending patent application Ser. No. 645,672 filed Dec. 31, 1975, now U.S. Pat. No. 4,006,040, in the names of Mike F. Chang, Thomas R. Anthony and Harvey E. Cline and entitled Semiconductor Device Manufacture. This application is incorporated herein by reference.

Figure 12:
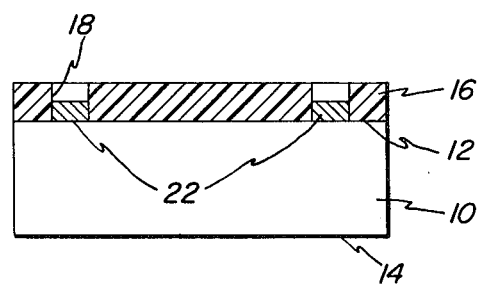

Referring now to FIG. 12, the process might alternately be practiced by utilizing the oxide layer 16 as mask to restrain the lateral flow of the metal when the melt is formed. The metal 22 may be sintered by a process described heretofore or may be migrated without sintering.

This alternate procedure often does not retain the dimensional stability of the configuration of the metal when it becomes molten. Some flow of melt of the metal-rich semiconductor material may occur under the layer 16 of the interface with surface 12 in the vicinity of the window 18. However, if dimensional stability is not critical then this alternate process may be practiced.

For a more detailed teaching of the employment of the layer 16 as a means to aid in initiating the thermal gradient zone melting process, one is directed to copending patent application Ser. No. 634,247, filed Nov. 21, 1975, now abandoned, in the names of Mike F. Chang, Thomas R. Anthony and Harvey E. Cline and entitled Method For Thermomigration of Selected Metals Through Bodies of Semiconductor Material. This application is incorporated herein by reference.

Figure 13:
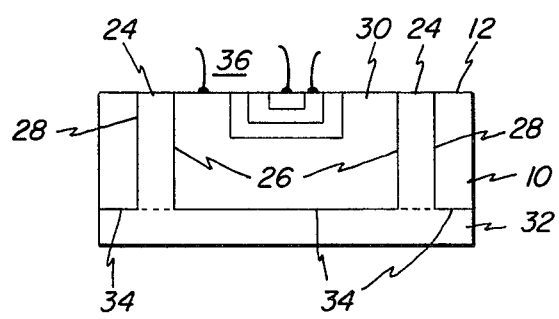

This improved process of this patent application is suitable for the fabrication of planar or mesa devices in the region 30 when a grid structure or annular structure is produced. However, it is sometimes desirable that the region 30 be electrically isolated from the surface 14 as well. Referring now to FIG. 13, a region 32 of the same type conductivity as that of region 24 and opposite to that of region 30 is formed in the body 10. The region 32 may be formed by epitaxial growth, diffusion and the like to form a cell comprising the electrically isolated region 30. A P-N junction 34 is formed by the abutting contiguous surfaces of the material of regions 30 and 32 of opposite type conductivity. An electrical device 36 such, for example, as a planar SCR is obtained after the forming of the regions 24 and 32.

Figure 14:
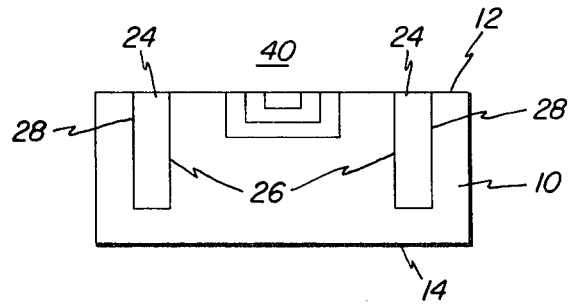

Referring now to FIG. 14, the novel process may be practiced wherein the region 24 only extends to a predetermined distance from surface 12 into the body 10. A semiconductor device 40, such as a diode and the like, may be formed in the area of several intersecting regions 24. The device 40 may be formed before or after the formation of the regions 24.

For a more thorough discussion of the process of migrating metal layers as a melt part way into a solid body of semiconductor material, one is directed to the copending application Ser. No. 559,262, filed Mar. 17, 1975, and now U.S. Pat. No. 3,988,770, in the names of Thomas R. Anthony and Harvey E. Cline, and entitled Deep Finger Diodes, the teachings of which are incorporated herein by reference thereto.

This invention is related to U.S. Patent Application Ser. No. 733,239 filed of even date herewith of the patent application in the names of Harvey E. Cline and Thomas R. Anthony, now U.S. Pat. No. 4,087,239, and entitled "Apparatus For Imparting Combined Centro-Symmetric and Noncentro-Symmetric Rotation to Semiconductor Bodies". This application is assigned to the assignee of the present invention and discloses and claims an apparatus which imparts a planetary rotation to semiconductor bodies while the bodies undergo processing by temperature gradient zone melting.

We claim as our invention:

1. An improved method for migrating a molten zone through a solid body of semiconductor material comprising the process steps of:

(a) selecting a body of single crystal semiconductor material having two major opposed surfaces, a predetermined type conductivity, a predetermined level of resistivity, a preferred diamond cubic crystal structure, a preferred planar crystal orientation for at least a first major surface, said orientation being one selected from the group consisting of (100), (110) and (111), and a first preferred crystal axis and a central axis, each of which axes being substantially perpendicular to at least the first major surface and substantially parallel with each other;

(b) depositing a layer of a metal of a predetermined thickness and having a predetermined geometrical configuration on the first major surface having the preferred planar orientation;

(c) disposing the body on a supporting surface at a distance remote from the central axis of the supporting surface;

(d) rotating the supporting surface about its central axis;

(e) translating the supporting surface, and the body, through a distance in a plane parallel to a heat source comprising a parallel array of lamps and at an angle of between 30° and 60° to the central axis of said lamp array while simultaneously rotating the supporting surface about its own central axis;

(f) heating the body and the deposited metal to a predetermined elevated temperature with said heat source, said elevated temperature being sufficient to form a melt of a metalrich semiconductor material on the first major surface of the body while continuing the translation of the body;

(g) establishing a temperature gradient substantially parallel with the central axis of the body and the first preferred crystal axis of the crystal structure of the material while continuing the translation of the body, the first major surface on which the melt is formed being at the lower temperature, and (h) migrating each metal of metal-rich semiconductor material as a molten zone through the solid body of the semiconductor material for a sufficient period of time to reach a predetermined distance into the body from the first major surface while continuing the translation of the body, to form in situ at least one region of recrystallized semiconductor material of the body having solid solubility of the deposited metal therein, a substantially uniform cross-sectional area and a substantially uniform level of resistivity throughout the entire region.

2. The method of claim 1 wherein the semiconductor material of the body is one selected from the group consisting of silicon, silicon carbide, germanium and gallium arsenide.

3. The method of claim 2 including, prior to depositing the metal, the additional process step of:

depositing a layer of a material which is one selected from the group consisting of silicon oxide, silicon nitride, aluminum oxide and aluminum nitride on the first major surface having the preferred crystal planar orientation, and etching selectively the layer of material to open at least one window therein to expose a predetermined surface area of the body defining the geometric configuration for the metal to be deposited therein.

4. The method of claim 3 wherein
   the semiconductor material is silicon of N-type conductivity, and
   the metal is aluminum.

5. The method of claim 3 wherein
   the layer of metal is heated to a predetermined elevated temperature to sinter a portion of the metal with the semiconductor material in contact therewith.

6. The method of claim 1 including, prior to depositing the metal layer, the additional process step of:

etching selectively the first major surface having the preferred crystal planar orientation to form at least one trough-like depression therein having a preferred geometrical configuration.

7. The method of claim 6 wherein
   the semiconductor material of the body is one selected from the group consisting of silicon, silicon carbide, germanium and gallium arsenide.

8. The method of claim 7 including, prior to depositing the metal, the additional process step of;

depositing a layer of a material which is one selected from the group consisting of silicon oxide, silicon nitride, aluminum oxide and aluminum nitride on the first major surface having the preferred crystal planar orientation, and etching selectively the layer of material to open at least one window therein to expose a predetermined surface area of the body defining the geometrical configuration for the metal to be deposited therein.

9. The method of claim 8 wherein
   the semiconductor material is silicon of N-type conductivity, and
   the metal is aluminum.

10. The method of claim 9 wherein
    the layer of aluminum is substantially oxygen free.

11. The method of claim 8 wherein
    the layer of metal is heated to a predetermined elevated temperature to sinter a portion of the metal with the semiconductor material in contact therewith.

12. The method of claim 1 including the additional process step of forming on the body a planar layer of semiconductor material of a conductivity type opposite to that of the material of the body, said planar layer having two opposed major surfaces substantially parallel to each other and to the major opposed surfaces of the body, a major surface of the planar layer being coextensive and contiguous with the second major surface of the body, and wherein each melt is migrated a predetermined distance through the body from the first major surface to at least intersect, and be integral with, the planar layer and to form a cell of material of the body electrically isolated from the remaining material of the body and from the second major surface of the body.

13. The method of claim 1 including the additional process step of forming a planar layer of semiconductor material on the second major surface of the body, the material of the planar layer having opposed major surfaces which are substantially parallel with each other and to the opposed major surfaces of the body, and wherein each melt is migrated a predetermined distance through the body from the first major surface to at least intersect and be integral with the planar layer and to form a cell of material of the body electrically isolated from the remaining material of the body and from the second major surface of the body.

* * * * *